US012712436B2

(12) United States Patent
Nora et al.

(10) Patent No.: US 12,712,436 B2
(45) Date of Patent: Aug. 18, 2026

(54) PROVIDING TIMING SIGNALS TO GATE DRIVERS OF A CONVERTER

(71) Applicant: Microchip Technology Incorporated, Chandler, AZ (US)

(72) Inventors: Paolo Nora, Belgioioso (IT); Isaac Terasuth Ko, Kowloon (CN); Claudiu Patru, Buchare (RO)

(73) Assignee: Microchip Technology Incorporated, Chandler, AZ (US)

( * ) Notice: Subject to any disclaimer, the term of this patent is extended or adjusted under 35 U.S.C. 154(b) by 241 days.

(21) Appl. No.: 18/180,030

(22) Filed: Mar. 7, 2023

(65) Prior Publication Data

US 2023/0318438 A1 Oct. 5, 2023

Related U.S. Application Data

(60) Provisional application No. 63/268,933, filed on Mar. 7, 2022.

(51) Int. Cl.
*H02M 1/08* (2006.01)
*H02M 1/088* (2006.01)
(Continued)

(52) U.S. Cl.
CPC ........... *H02M 1/088* (2013.01); *H02M 3/158* (2013.01); *H03K 17/6872* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30;
(Continued)

(56) References Cited

U.S. PATENT DOCUMENTS 6,043,634 A 3/2000 Nguyen et al.
6,346,798 B1 * 2/2002 Passoni ............... H02M 3/1584 363/69
(Continued)

FOREIGN PATENT DOCUMENTS

KR 2019-0052353 A 5/2019

OTHER PUBLICATIONS

International Search Report for International Application No. PCT/US2023/063886, mailed Jun. 6, 2023, 6 pages.
(Continued)

*Primary Examiner* — Jeffrey A Gblende
(74) *Attorney, Agent, or Firm* — TraskBritt

(57) ABSTRACT

One or more examples relate, generally, to providing timing signals to gate drivers of a converter. An example apparatus for providing timing signals to gate drivers of a converter includes a circuit that includes a timing input, and a plurality of outputs. The timing input may receive an incoming timing signal. The plurality of outputs may couple to a respective plurality of gate drivers to control an output voltage of a converter. The circuit may provide respective timing signals, at respective ones of the plurality of outputs at least partially responsive to the incoming timing signal, the respective timing signals synchronized such that like edges of the respective timing signals coincide.

20 Claims, 13 Drawing Sheets

(51) Int. Cl.
*H02M 3/158* (2006.01)
*H03K 17/687* (2006.01)

(58) Field of Classification Search
CPC ... G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069
See application file for complete search history.

(56) References Cited

U.S. PATENT DOCUMENTS

| | | | | |
|---|---|---|---|---|
| 7,145,368 | B2 * | 12/2006 | Hashimoto | G06F 1/08 327/99 |
| 9,214,866 | B2 * | 12/2015 | Nora | H02J 1/102 |
| 10,756,627 | B2 * | 8/2020 | Hsu | H02M 3/158 |
| 2004/0151010 | A1 | 8/2004 | Jonsson | |
| 2008/0082839 | A1 | 4/2008 | Dibene et al. | |
| 2009/0327786 | A1 | 12/2009 | Carroll et al. | |
| 2010/0013306 | A1 | 1/2010 | Heineman et al. | |
| 2014/0159506 | A1 | 6/2014 | Kim et al. | |
| 2015/0042384 | A1 | 2/2015 | Voss | |
| 2019/0214910 | A1 * | 7/2019 | Thomas | H02M 3/1582 |
| 2021/0257909 | A1 | 8/2021 | Roessig et al. | |

OTHER PUBLICATIONS

Written Opinion of the International Searching Authority for International Application No. PCT/US2023/063886, mailed Jun. 6, 2023, 9 pages.

* cited by examiner

PROVIDING TIMING SIGNALS TO GATE DRIVERS OF A CONVERTER

CROSS-REFERENCE TO RELATED APPLICATION

This application claims the benefit of the priority date of U.S. Provisional Patent Application No. 63/268,933, filed Mar. 7, 2022, and titled "GATE-DRIVE-COMMAND BROADCASTING FOR DIRECTLY-PARALLELABLE-POWER STAGES IN MAIN-REPLICA ARRANGEMENT WITH MEANS TO COUNTERACT THE EFFECTS OF GATE DRIVERS' DELAY MISMATCH," the disclosure of which is incorporated herein in its entirety by this reference.

TECHNICAL FIELD

This description relates, generally, to timing signals. More specifically, some examples relate to providing timing signals to gate drivers of a DC-to-DC converter, without limitation.

BACKGROUND

Direct current (DC)-to-DC power converters include buck converters (or "step-down converters") and boost converters (or "step-up converters"), without limitation. A buck converter may receive an input voltage and supply an output voltage that is lower than the input voltage. A boost converter may receive an input voltage and supply an output voltage that is greater than the input voltage. Such DC-to-DC converters may include one or more energy-storage elements (e.g., an inductor and/or a capacitor). A gate driver may alternately provide the input voltage to the one or more energy-storage elements to alternately charge the one or more energy-storage elements and allow the one or more energy-storage elements to discharge to provide the output voltage. A timing signal may be used to control the gate driver to control when the one or more energy-storage elements are charging and discharging.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

Figure 1:
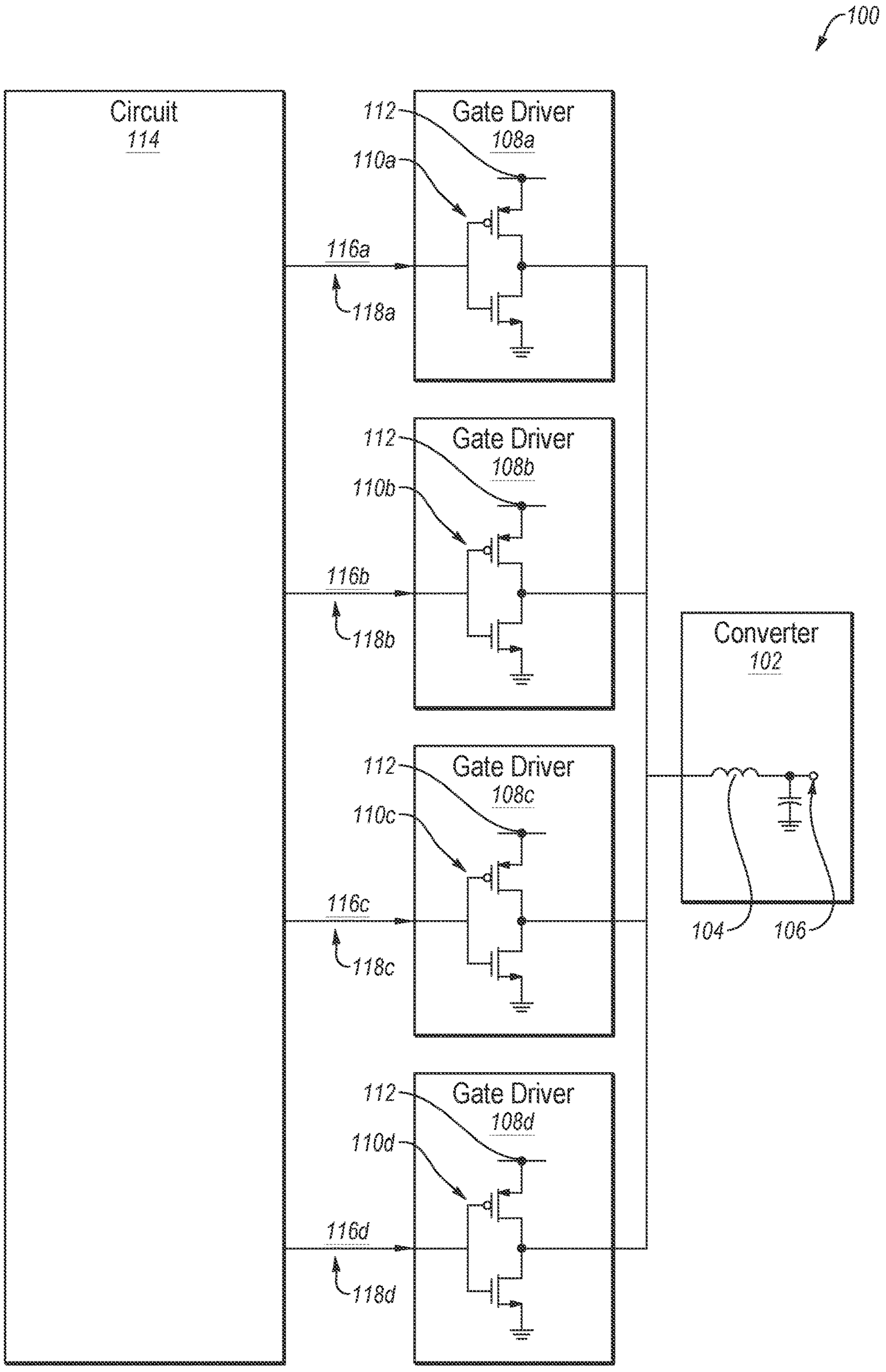
FIG. 1 is a functional block diagram illustrating an apparatus according to one or more examples.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be depicted by block diagram form in order not to obscure the present disclosure in unnecessary detail. Conversely, specific implementations shown and described are only examples and should not be construed as the only way to implement the present disclosure unless specified otherwise herein. Additionally, block definitions and partitioning of logic between various blocks is an example of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, and symbols that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal. A person having ordinary skill in the art would appreciate that this disclosure encompasses communication of quantum information and qubits used to represent quantum information.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer executes computing instructions (e.g., software code, without limitation) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, or a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In this description the term "coupled" and derivatives thereof may be used to indicate that two elements co-operate or interact with each other. When an element is described as being "coupled" to or with another element, then the elements may be in direct physical or electrical contact or there may be one or more intervening elements or layers present. In contrast, when an element is described as being "directly coupled" to or with another element, then there are no intervening elements or layers present. It will be understood that when an element is referred to as "coupling" a first element and a second element then it is coupled to the first element and it is coupled to the second element.

A DC-to-DC converter may include one or more energy-storage elements e.g., an inductor, and/or a capacitor. A gate driver may alternately provide current from an input-voltage line to the one or more energy-storage elements to alternately charge the one or more energy-storage elements and to allow the one or more energy-storage elements to discharge such that the DC-to-DC converter provides an output voltage. The ratio between the output voltage and an input voltage of the input-voltage line may be based on a ratio between the duration of time the one or more energy-storage elements are being charged to the duration of time the one or more energy-storage elements are allowed to discharge. A timing signal may be used to control the gate driver to control when the one or more energy-storage elements are being charged and discharged and thereby control the ratio between the input voltage and the output voltage.

In some circumstances, it may be advantageous to use multiple gate drivers to control a DC-to-DC converter. A component of a gate driver is a switch, which may be a transistor. Such switches may have a current rating or current limit. In some circumstances, it may be desirable to provide more current to an energy-storage element (e.g., an inductor) of a DC-to-DC converter than can be provided by one desirable switch. For example, a desirable switch may be capable of allowing 2 amperes (A) of current to flow therethrough. The desirable switch may be less expensive than other switches that may allow more current to flow therethrough. In some circumstances, it may be advantageous to provide 8 A of current to an energy-storage element of a DC-to-DC converter. In such circumstances, it may be advantageous to provide current to the energy-storage element using four desirable switches. For example, four desirable switches may be more cost effective than one switch capable of allowing 8 A to flow therethrough.

When providing current to a DC-to-DC converter through multiple parallel gate drivers, synchronizing timing between the gate drivers may be desirable. For example, if one of the gate drivers turns ON and provides current before one or more of the others turn ON and provide current, the DC-to-DC converter (including the gate drivers) may exhibit instability. More specifically, its switch current (provided current) may be higher than the switch currents of the other gate drivers due to non-zero bond wire inductance, and may not have sufficient time to recover in a single clock period, especially for low duty-cycle operation. The effect can accumulate over many clock cycles and result in run-away of a buck switch.

Examples may provide synchronized timing signals for multiple gate drivers. By providing synchronized timing signals, the examples may prevent or decrease instability in the DC-to-DC converter and/or in the gate drivers.

Additionally or alternatively, some examples may provide a selectable number of timing signals. For example, some examples may receive a control signal and may provide the selectable number of timing signals responsive to the control signal. Among the selectable number of timing signals, one or more of the timing signals may be synchronized with another of the timing signals.

One or more examples may be included in a circuit for path length matching among multiple gate driver input signals, a circuit for buffer count matching, or a variable delay line. One or more examples may be included in a power-management integrated circuit (PMIC) or power management unit (PMU).

FIG. 1 is a functional block diagram illustrating an apparatus 100 according to one or more examples. Apparatus 100 may include a circuit 114 that may provide synchronized timing signals 116 (timing signals 116 include, as non-limiting examples, timing signal 116*a*, timing signal 116*b*, timing signal 116*c*, and timing signal 116*d*). Timing signals 116 may, as a non-limiting example, respectively control gate drivers 108 (gate drivers 108 include, as non-limiting examples, gate driver 108*a*, gate driver 108*b*, gate driver 108*c*, and gate driver 108*d*) to control an output voltage 106 of a DC-to-DC converter 102. For simplicity, DC-to-DC converter 102 is simply called converter 102.

Apparatus 100 may include converter 102. Converter 102 may include an inductor 104. Apparatus 100 may include a plurality of gate drivers 108. Gate drivers 108 may include respective switches 110 (switches 110 include, as non-limiting examples, switch 110*a*, switch 110*b*, switch 110*c*, and switch 110*d*) coupled between a supply-voltage line 112 and inductor 104. Apparatus 100 may include circuit 114 to provide respective timing signals 116 to the respective switches 110 of the plurality of gate drivers 108 to control the plurality of gate drivers 108 to control output voltage 106 of converter 102. Circuit 114 may synchronize timing signals 116 such that like edges 118 (edges 118 include, as non-limiting examples, edges 118*a*, edges 118*b*, edges 118*c*, and edges 118*d*, respectively) of timing signals 116 coincide.

Converter 102 may be, or may include, any suitable converter, including, as a non-limiting example, a buck or step-down converter, a boost converter, a buck-boost converter, or any converter that includes a bond wire inductance coupled in series with a switch. Converter 102 includes inductor 104, which may be an energy-storage element. Additionally, converter 102 may include a capacitor (illustrated in FIG. 1 but not labeled). Additionally, converter 102 may include a freewheeling diode (or a switch in place of the freewheeling diode) (not illustrated in FIG. 1). Converter 102 may receive input current at an input voltage at an input of converter 102 and may provide output current at an output voltage 106 at an output of converter 102.

Apparatus 100 includes gate drivers 108 to provide input current to converter 102. It may be important to the stability of apparatus 100 that each of gate drivers 108 provides current at the same time. Apparatus 100 includes four gate drivers 108 as an example. Other examples may include other numbers of gate drivers 108. Likewise, circuit 114 provides four timing signals 116 (each having respective edges 118) as an example. Other example circuits may provide other numbers of timing signals 116 (each having respective edges 118).

Gate drivers 108 include respective switches 110 between a common supply-voltage line 112 and converter 102, e.g., to a first terminal of inductor 104. Gate drivers 108 may additionally include additional switches (illustrated in FIG. 1 but not labeled) between a common ground (illustrated in FIG. 1 but not labeled) and converter 102, e.g., to the first terminal of inductor 104.

Gate drivers 108 may receive respective timing signals 116 and respective switches 110 (and the additional switches) may open and close responsive to respective timing signals 116. Because the stability of apparatus 100 may depend on current being provided by gate drivers 108 to converter 102 at the same time, the stability of apparatus 100 may depend on timing signals 116 being synchronized, i.e., to control switches 110 to open and close at the same time.

Circuit 114 may provide timing signals 116 that may be synchronized. In particular, respective like edges 118 of timing signals 116 may coincide. In other words, timing signal 116*a*, timing signal 116*b*, timing signal 116*c*, and timing signal 116*d* may exhibit leading edges at the same time and may exhibit trailing edges at the same time.

Figure 2:
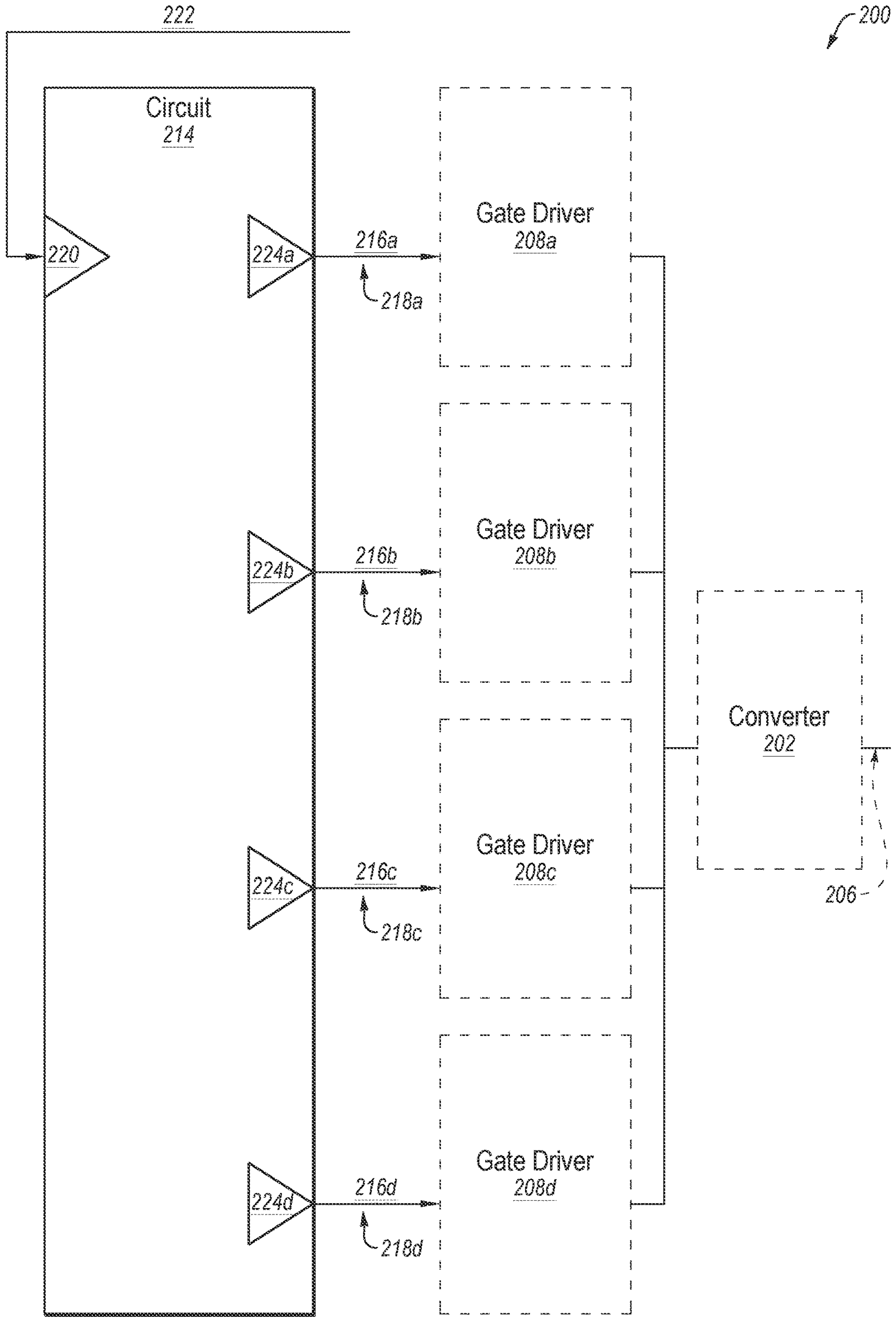
FIG. 2 is a functional block diagram illustrating another apparatus according to one or more examples.

FIG. 2 is a functional block diagram illustrating an apparatus 200 according to one or more examples. Apparatus 200 may include a circuit 214 that may provide synchronized timing signals 216.

Circuit 214 may include a timing input 220 to receive an incoming timing signal 222. Circuit 214 may include a plurality of outputs 224 (outputs 224 include, as non-limiting examples, output 224*a*, output 224*b*, output 224*c*, and output 224*d*) to couple to a respective plurality of gate drivers 208 (gate drivers 208 include, as non-limiting examples, gate driver 208*a*, gate driver 208*b*, gate driver 208*c*, and gate driver 208*d*) to control an output voltage 206 of a converter 202. Circuit 214 may provide timing signals 216 (timing signals 216 include, as non-limiting examples, timing signal 216*a*, timing signal 216*b*, timing signal 216*c*, and timing signal 216*d*), at respective ones of the plurality of outputs 224 at least partially responsive to incoming timing signal 222. Timing signals 216 may be synchronized such that like edges 218 (edges 218 include, as non-limiting examples, edge 218*a*, edge 218*b*, edge 218*c*, and edge 218*d*) of respective timing signals 216 coincide.

In this disclosure, elements of some drawings or apparatuses may be the same as, or substantially similar to, elements of other drawings or other apparatuses. Thus, a reference number having the same last two digits as a corresponding reference number in another drawing, may indicate that elements referenced by the respective reference numbers are substantially the same, absent explicit description to the contrary. As a non-limiting example, converter 202 of FIG. 2 may be the same as, or substantially similar to converter 102 of FIG. 1.

In FIG. 2, converter 202, output voltage 206, and gate drivers 208 are optional. The optional nature of converter 202, output voltage 206, and gate drivers 208 are depicted in FIG. 2 by converter 202, output voltage 206, and gate drivers 208 being illustrated using dashed lines.

Apparatus 200 includes four outputs 224, providing respective timing signals 216, having respective edges 218, to respective gate drivers 208, as an example. Other examples may include other numbers of outputs 224, providing respective other numbers of timing signals 216, having respective edges 218, to respective other numbers of gate drivers 208.

In addition to elements that are the same as, or substantially similar to elements of apparatus 100 of FIG. 1, apparatus 200 includes timing input 220 and outputs 224. Timing input 220 may be, or may include, a point at which circuit 214 may receive incoming timing signal 222, which incoming timing signal 222 may be an electrical signal e.g., repeating binary signal, e.g., a clock signal. Timing input 220 may be, or may include a line or a pin. Outputs 224 may be, or may include, points at which circuit 214 may provide timing signals 216, which timing signals 216 may be electrical signals, e.g., repeating binary signals. Outputs 224 may include respective lines or pins.

Figure 3:
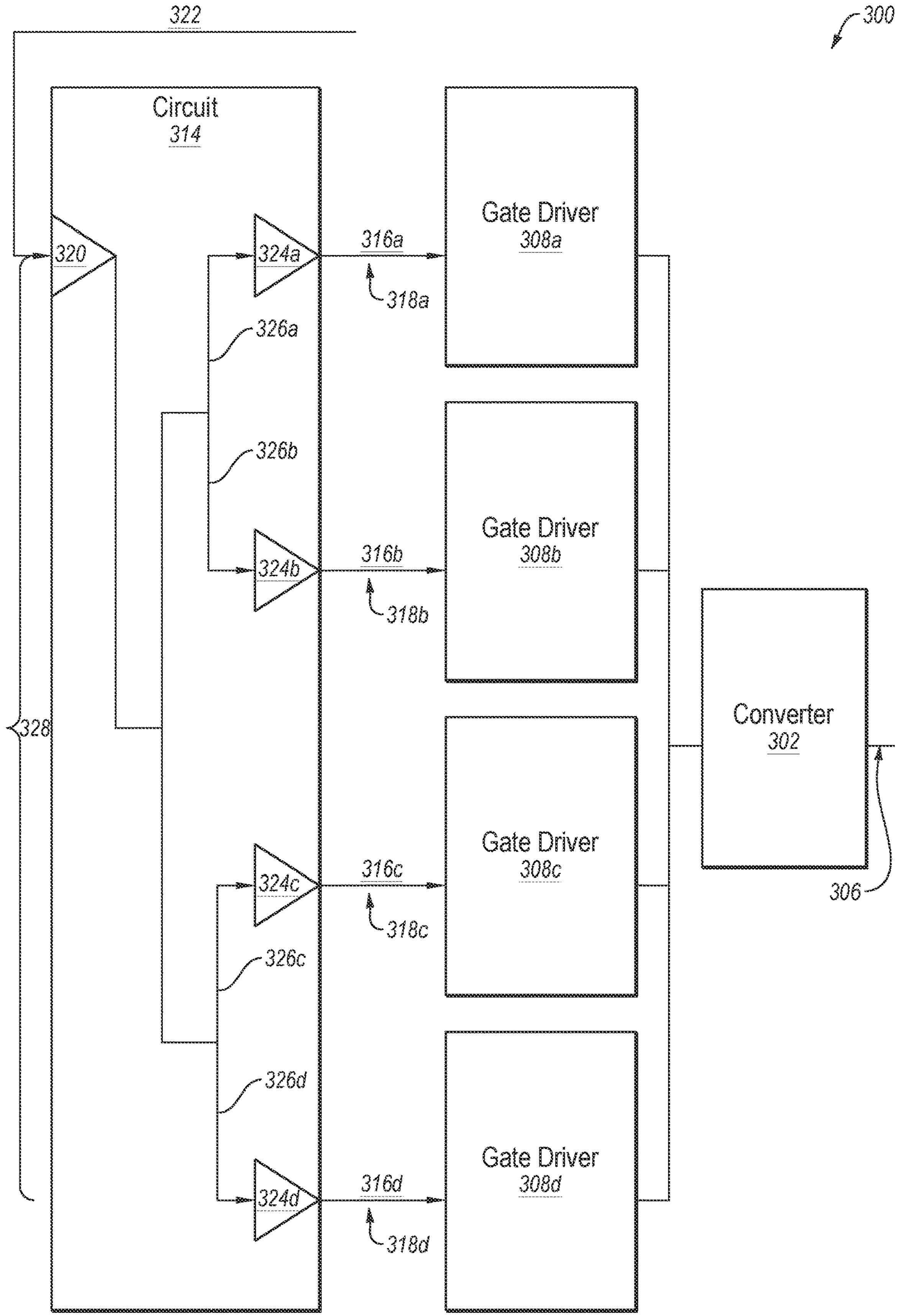
FIG. 3 is a functional block diagram illustrating yet another apparatus according to one or more examples.

FIG. 3 is a functional block diagram illustrating an apparatus 300 according to one or more examples. Circuit 314 is an example of circuit 114 of FIG. 1 and/or of circuit 214 of FIG. 2. Circuit 314 is an example of how a circuit (e.g., circuit 114 and circuit 214) may synchronize timing signals 316.

In particular, circuit 314 may include respective lines 326 (lines 326 includes, as non-limiting examples, line 326*a*, line 326*b*, line 326*c*, and line 326*d*) between timing input 320 and respective ones of the plurality of outputs 324 (outputs 324 include, as non-limiting examples, output 324*a*, output 324*b*, output 324*c*, and output 324*d*). Respective lines 326 may define the same path length 328 between timing input 320 and the respective ones of the plurality of outputs 324.

For example, line 326*a* may include the entirety of the line between timing input 320 and output 324*a*, line 326*b* may include the entirety of the line between timing input 320 and output 324*b*, line 326*c* may include the entirety of the line between timing input 320 and output 324*c*, and line 326*d* may include the entirety of the line between timing input 320 and output 324*d*. Each of line 326*a*, line 326*b*, line 326*c*, and line 326*d* may have the same path length 328. Each of line 326*a*, line 326*b*, line 326*c*, and line 326*d* having the same path length 328 may cause propagation delay between timing input 320 and each of output 324*a*, output 324*b*, output 324*c*, and output 324*d* to be the same. Having the same propagation delay may cause timing signal 316*a*, timing signal 316*b*, timing signal 316*c*, and timing signal 316*d* to be synchronized, or, in other words, to have coinciding like edges 318*a*, 318*b*, 318*c*, and 318*d*, respectively. As described above, timing signal 316*a*, timing signal 316*b*, timing signal 316*c*, and timing signal 316 are coupled to respectively control gate drivers 308*a*, 308*b*, 308*c* and 308*d* to respectively provide current to converter 302 so as to provide an output current at output voltage 306.

Figure 4:
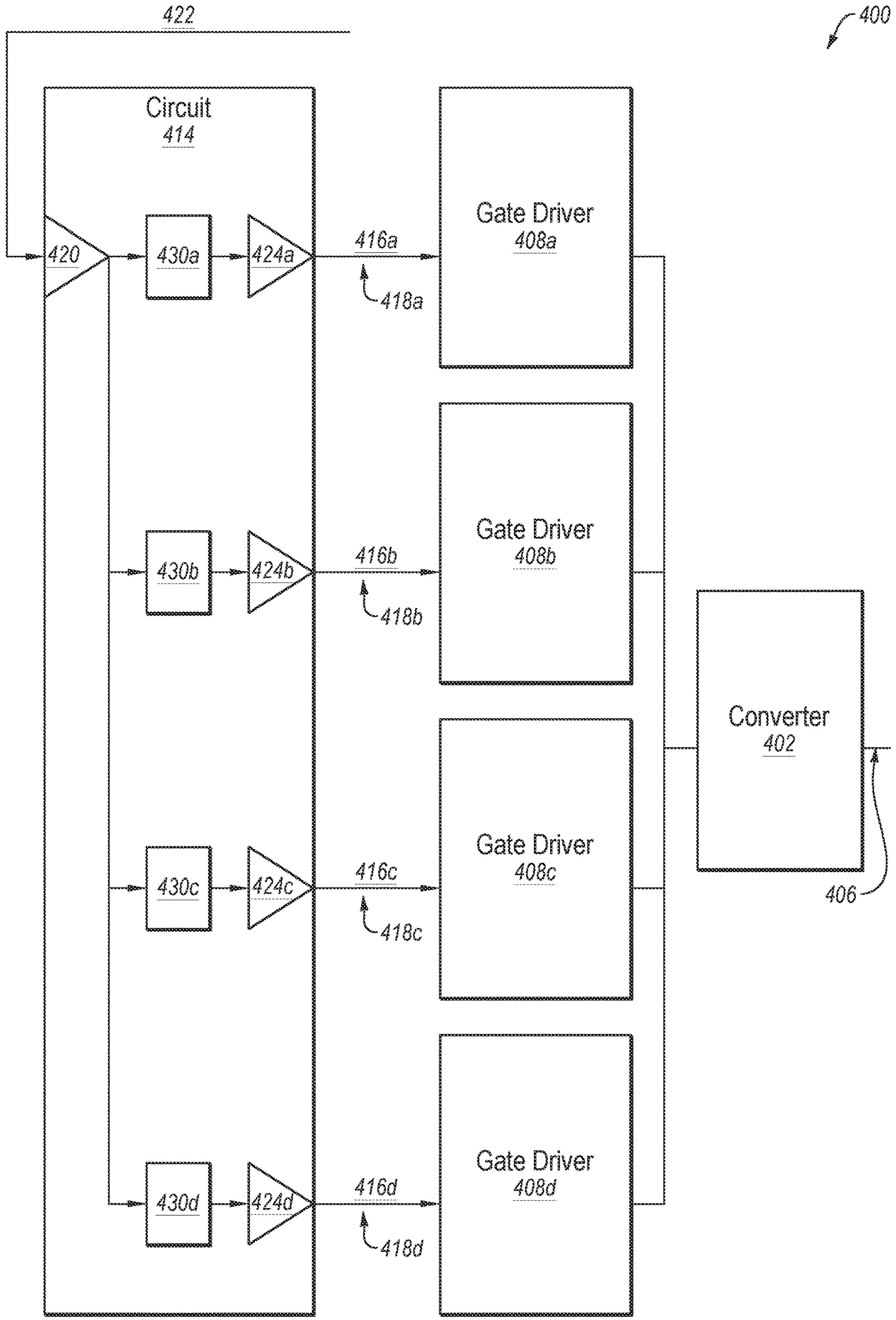
FIG. 4 is a functional block diagram illustrating yet another apparatus according to one or more examples.

FIG. 4 is a functional block diagram illustrating an apparatus 400 according to one or more examples. Circuit 414 is an example of circuit 114 of FIG. 1 and/or of circuit 214 of FIG. 2. Circuit 414 is another example of how a circuit (e.g., circuit 114 and circuit 214) may synchronize timing signals 416.

In particular, circuit 414 may include delay cells 430 (delay cells 430 include, as non-limiting examples, delay cell 430*a*, delay cell 430*b*, delay cell 430*c*, and delay cell 430*d*). Circuit 414 may apply incoming timing signal 422, received at timing input 420 to delay cells 430 to synchronize timing signals 416 (e.g., timing signals 416*a*, 416*b*, 416*c* and 416*d*, respectively) provided at the respective ones of the plurality of outputs 424 for provision to respective gate drivers 408*a*, 408*b*, 408*c* and 408*d*, whose outputs are coupled to converter 402 to provide output voltage 406.

For example, delay cell 430*a* may be coupled between timing input 420 and output 424*a*, delay cell 430*b* may be coupled between timing input 420 and output 424*b*, delay cell 430*c* may be coupled between timing input 420 and output 424*c*, and delay cell 430*d* may be coupled between timing input 420 and output 424*d*. Delay cells 430 may individually delay incoming timing signal 422 between timing input 420 and outputs 424, respectively, such that timing signals 416 are synchronized, or in other words, such that timing signals 416 have coinciding like edges 418 (e.g., edges 418*a*, 418*b*, 418*c* and 418*d*, respectively).

As a non-limiting example, delay cell 430*d* may cause a relatively short delay (or may cause no delay, or may, in some non-limiting examples be omitted). Delay cell 430*c* may cause a longer delay than is caused by delay cell 430*d*. The difference in the delay caused by delay cell 430*d* and the delay caused by delay cell 430*c* may be based on a path-length difference between the path-length between timing input 420 and output 424*d* and the path-length between timing input 420 and output 424*c*. For example, the path between timing input 420 and output 424*d* may be longer than the path length between timing input 420 and output 424*c*. The path-length difference may result in incoming timing signal 422 being delayed by a longer propagation delay between timing input 420 and output 424*d* than between timing input 420 and output 424*c*. The path-length difference may include the physical line length and/or delays caused by other elements (including logic elements) between timing input 420 and the respective outputs 424. Examples of such elements are described with regard to FIG. 7 through FIG. 10. The difference between the delay caused by delay cell 430*d* and the delay caused by delay cell 430*c* may account for the difference in propagation delay such that timing signal 416*c* and timing signal 416*d* are synchronized. Similarly, delay cell 430*b* may cause a longer delay that is caused by delay cell 430*c* and delay cell 430*a* may cause a longer delay than is caused by delay cell 430*b*.

Delay cells 430 may be, or may include, circuit components that may delay a signal as the signal passes through the respective delay cells 430. For example, respective delay cells 430 may include a distributive resistor-capacitor (RC) circuit, a number of pairs of buffers/inverters, and a variable delay line that adjusts a supply current to buffers/inverters.

Figure 5:
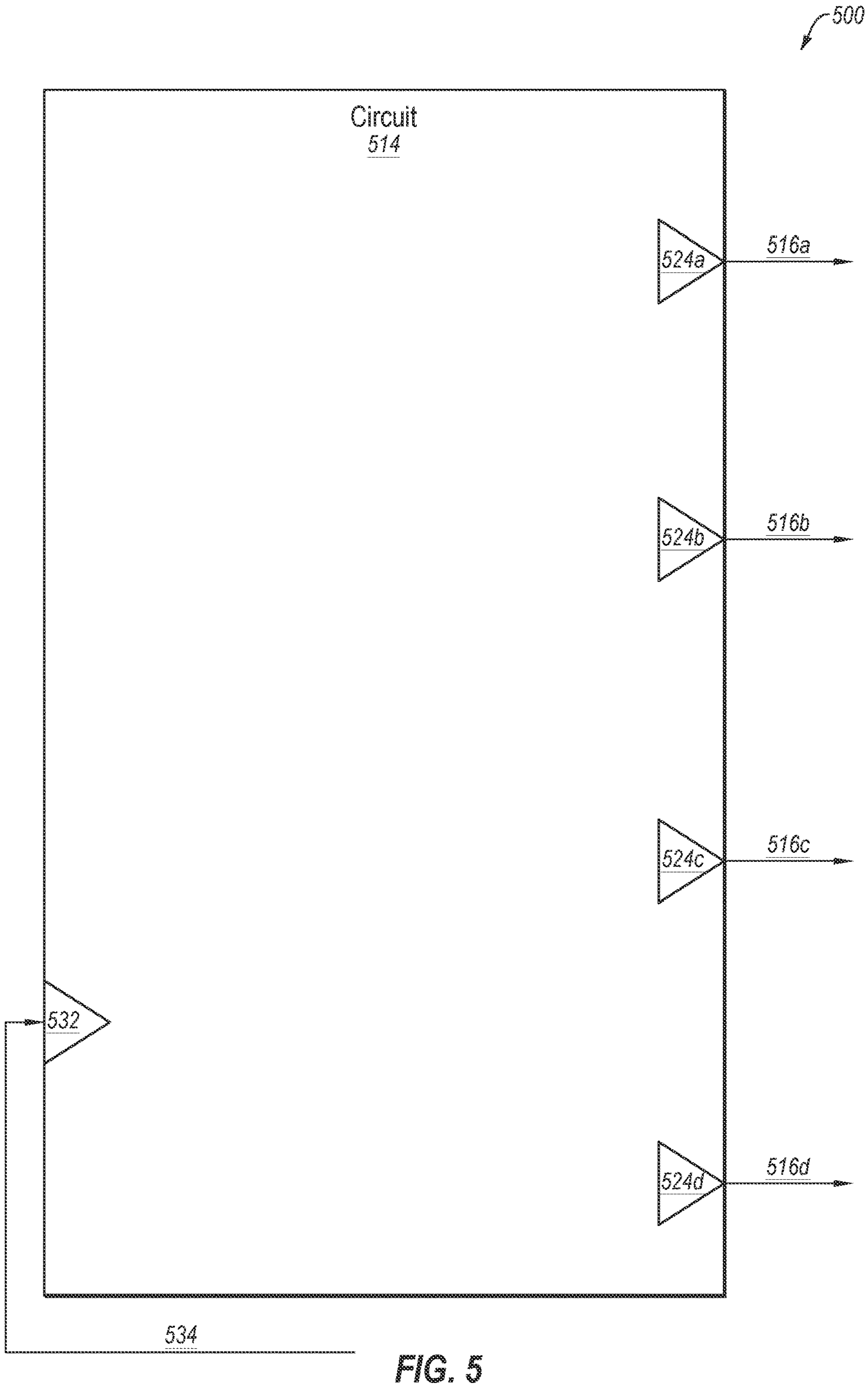
FIG. 5 is a functional block diagram illustrating yet another apparatus according to one or more examples.

FIG. 5 is a functional block diagram illustrating an apparatus 500 according to one or more examples. Apparatus 500 may include a circuit 514 that may provide a selectable number of timing signals 516.

Circuit 514 may include a control input 532 to receive a control signal 534. Circuit 514 may include a number of outputs 524 (e.g., outputs 524*a*, 524*b*, 524*c* and 524*d*). Circuit 514 may provide a selectable number of timing signals 516 (e.g., timing signals 516*a*, 516*b*, 516*c* and 516*d*), at respective ones of the number of outputs 524, at least partially responsive to control signal 534.

Control input 532 may be, or may include, a point at which circuit 514 may receive control signal 534, which control signal 534 may be an electrical signal indicative of a number of timing signals 516 to output. Control input 532 may be, or may include a line or a pin.

Additionally, circuit 514 may synchronize timing signals 516 such that like edges of timing signals 516 coincide. As non-limiting examples, circuit 514 may synchronize timing signals 516 as described above with regard to circuit 314 of FIG. 3 or with regard to circuit 414 of FIG. 4.

Figure 6:
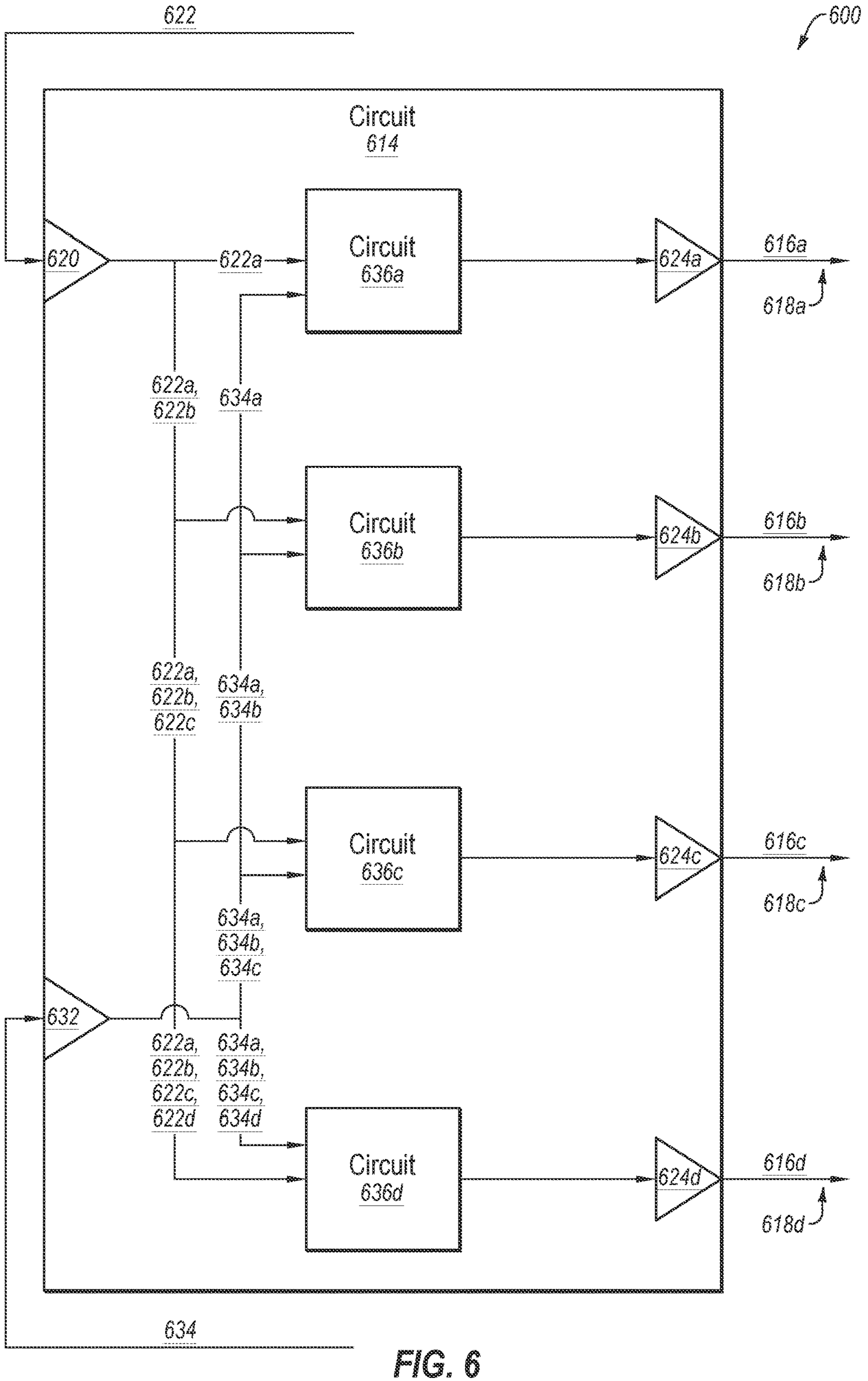
FIG. 6 is a functional block diagram illustrating yet another apparatus according to one or more examples.

FIG. 6 is a functional block diagram illustrating an apparatus 600 according to one or more examples. Apparatus 600 may include circuit 614. Circuit 614 is an example of circuit 514 of FIG. 5. Circuit 614 is an example of how a circuit (e.g., circuit 514) may provide a selectable number of timing signals 616 (e.g., timing signals 616*a*, 616*b*, 616*c* and 616*d*).

Circuit 614 may include circuits 636 (circuits 636 include, as non-limiting examples, circuit 636*a*, circuit 636*b*, circuit 636*c*, and circuit 636*d*) between incoming timing signal 622 and outputs 624. In particular, circuit 614 may include circuit 636*a* between timing input 620 and output 624*a*, circuit 636*b* between timing input 620 and output 624*b*, circuit 636*c* between timing input 620 and output 624*c*, and circuit 636*d* between timing input 620 and output 624*d*. Circuits 636 may provide a selectable number of timing signals 616 and provide timing signals 616 at respective outputs 624.

Control signals 634 may include one or more independent control signals, e.g., control signal 634*a*, control signal 634*b*, control signal 634*c*, and control signal 634*d*. Control signals 634 may be received at control input 632 and may be variously provided to circuits 636.

Control signals 634 may be indicative of the number of selectable number of timing signals 616 to generate and/or of relationships between timing signals 616. For example, control signals 634 may indicate, and circuits 636, responsive to control signals 634, may provide: four timing signals 616 wherein all four of timing signals 616 are synchronized, four timing signals 616 wherein three of timing signals 616 are synchronized and a fourth of timing signals 616 is not synchronized with the other three, four timing signals 616 wherein two separate pairs of two timing signals 616 are synchronized with each other but not with the timing signals 616 of the other pair.

Which of timing signal 616*a*, timing signal 616*b*, timing signal 616*c*, and timing signal 616*d* are synchronized, or not, with the others may be selectable. For example, timing signal 616*a* and timing signal 616*b* may be synchronized with each other and timing signal 616*c* and timing signal 616*d* may be synchronized with each other. As an alternative example, timing signal 616*a* and timing signal 616*c* may be synchronized with each other and timing signal 616*b* and timing signal 616*d* may be synchronized with each other. As an alternative example, timing signal 616*a* and timing signal 616*d* may be synchronized with each other and timing signal 616*b* and timing signal 616*c* may be synchronized with each other.

Incoming timing signals 622 may include one or more of independent incoming timing signals, e.g., incoming timing signal 622*a*, incoming timing signal 622*b*, incoming timing signal 622*c*, and incoming timing signal 622*d*. Incoming timing signals 622 may be received at timing input 620 and may be variously provided to circuits 636.

Circuits 636 may provide timing signals 616 based on incoming timing signals 622. In particular, one or more of timing signals 616 may be an instance of one of incoming timing signal 622. Additionally, any or all of timing signals 616 may be delayed (e.g., as described above with regard to FIGS. 1-4) such that the any, or all, of timing signals 616 are synchronized. Control signal 634 may indicate, and circuits 636 may provide, synchronized instances of selected ones of incoming timing signal 622. For example, control signals 634 may indicate that timing signal 616*a* and timing signal 616*b* are to be synchronized instances of incoming timing signal 622*a* and that timing signal 616*c* and timing signal 616*d* are to be synchronized instances of incoming timing signal 622*c*.

In some examples, relationships between timing signals 616 may be governed by rules, e.g., only consecutively ordered timing signals 616 may be synchronized with each other and synchronized timing signals 616 are to be instances of an incoming timing signal 622 to which they are to be synchronized. Thus, for example, if timing signal 616*b* is to be synchronized with timing signal 616*a*, both timing signal 616*a* and timing signal 616*b* will be appropriately delayed instances of incoming timing signal 622*a*. Further, timing signal 616*d* may not be synchronized with timing signal 616*a* or timing signal 616*b* unless timing signal 616*c* is also synchronized with timing signal 616*a* or timing signal 616*b*, respectively.

Figure 7:
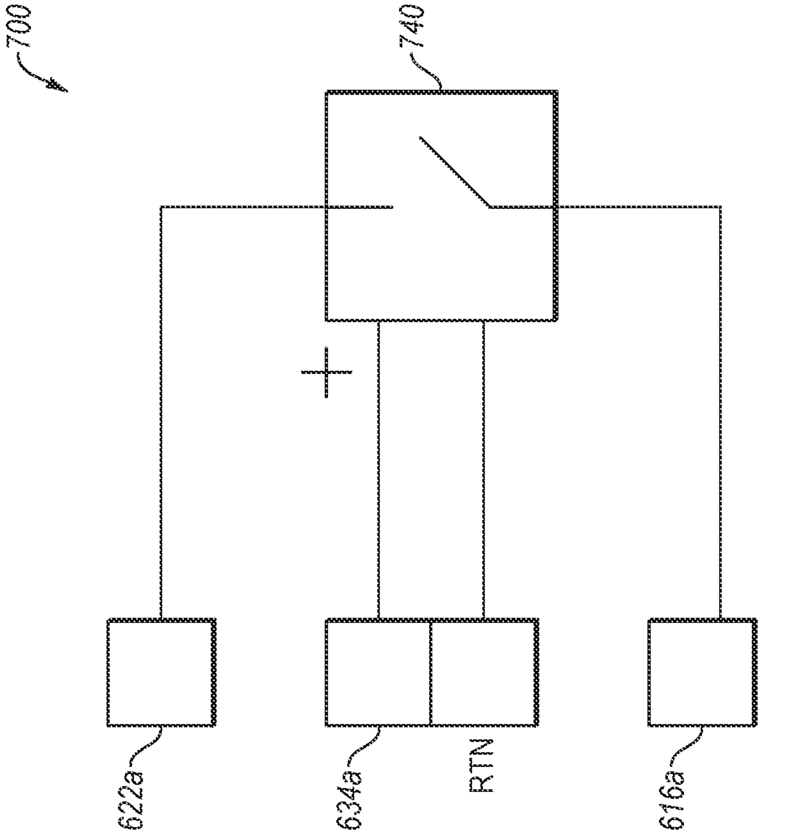
FIG. 7 is a functional block diagram illustrating a circuit according to one or more examples.

FIG. 7 is a functional block diagram illustrating a circuit 700 according to one or more examples. Circuit 700 is a non-limiting example of an implementation of circuit 636*a* of FIG. 6.

Circuit 700 may operate according to the example rules for governing relationships between timing signals 616 described above with regard to FIG. 6. Circuit 700 may include a switch 740 that may provide incoming timing signal 622*a* as timing signal 616*a* dependent on control signal 634*a*. For example, if control signal 634*a* indicates that timing signal 616*a* is to be provided, circuit 700 may provide incoming timing signal 622*a* as timing signal 616*a* by closing switch 740.

Returning to FIG. 6, circuit 614 may delay incoming timing signal 622*a* before providing timing signal 622*a* to circuit 636*a*. Additionally or alternatively, circuit 614 may delay timing signal 616*a* before providing timing signal 616*a* at output 624*a*. The delay may account for path lengths, delay associated with circuit 614 (including delays associated with circuit 636*a*) and/or delays to synchronize timing signal 616*a* with any other of timing signals 616 to which timing signal 616*a* is to be synchronized.

Figure 8:
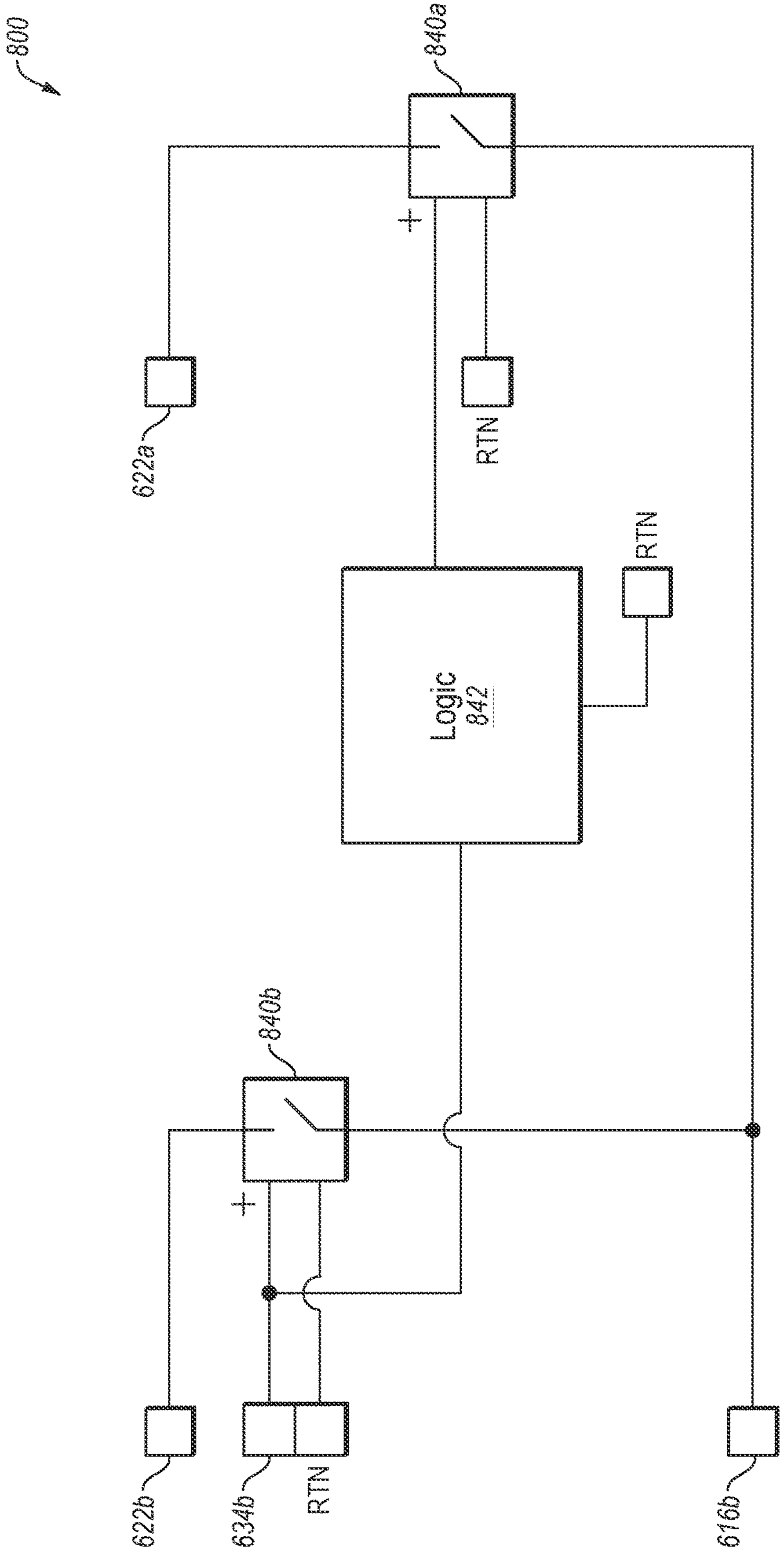
FIG. 8 is a functional block diagram illustrating another circuit according to one or more examples.

FIG. 8 is a functional block diagram illustrating a circuit 800 according to one or more examples. Circuit 800 is a non-limiting example of an implementation of circuit 636*b* of FIG. 6.

Circuit 800 may operate according to the example rules for governing relationships between timing signals 616 described above with regard to FIG. 6. Circuit 800 may include a switch 840*a*, a switch 840*b*, and logic 842. Circuit 800 may provide one of incoming timing signal 622*a* or incoming timing signal 622*b* as timing signal 616*b* dependent on control signal 634*b*. For example, if control signal 634*b* indicates that timing signal 616*b* is to be provided, and to be synchronized with timing signal 616*a* (timing signal 616*a* not shown in FIG. 8), circuit 800 may provide incoming timing signal 622*a* as timing signal 616*b* by closing switch 840*a* and opening switch 840*b*. (Because timing signal 616*a* may be timing signal 622*a*, providing timing signal 622*a* as timing signal 616*b* may synchronize timing signal 616*b* with timing signal 616*a*.) Else, if control signal 634*b* indicates that timing signal 616*b* is to be provided, but not to be synchronized with timing signal 616*a*, incoming timing signal 622*b* may be provided as timing signal 616*b* by closing switch 840*b* and opening switch 840*a*. The term "not synchronized" as used herein, indicates that the signals are not actively synchronized by the circuit under discussion, whether or not, in practice, they are in synchronization.

A Karnaugh map for timing signal 616*b* provided by circuit 800 may be:

| | 634d:634c | | | |
|---|---|---|---|---|
| 634b | 0:0 | 0:1 | 1:1 | 1:0 |
| 0 | 622a | 622a | 622a | 622a |
| 1 | 622b | 622b | 622b | 622b |

Returning to FIG. 6, circuit 614, may delay incoming timing signal 622*a* and/or incoming timing signal 622*b* before providing timing signal 622*a* and/or timing signal 622*b* to circuit 636*b*. Additionally or alternatively, circuit 614 may delay timing signal 616*b* before providing timing signal 616*b* at output 624*b*. The delay may account for path lengths, for delay associated with circuit 614 (including delays associated with circuit 636*b*), and/or delays to synchronize timing signal 616*b* with any other of timing signals 616 to which timing signal 616*b* is to be synchronized.

Figure 9:
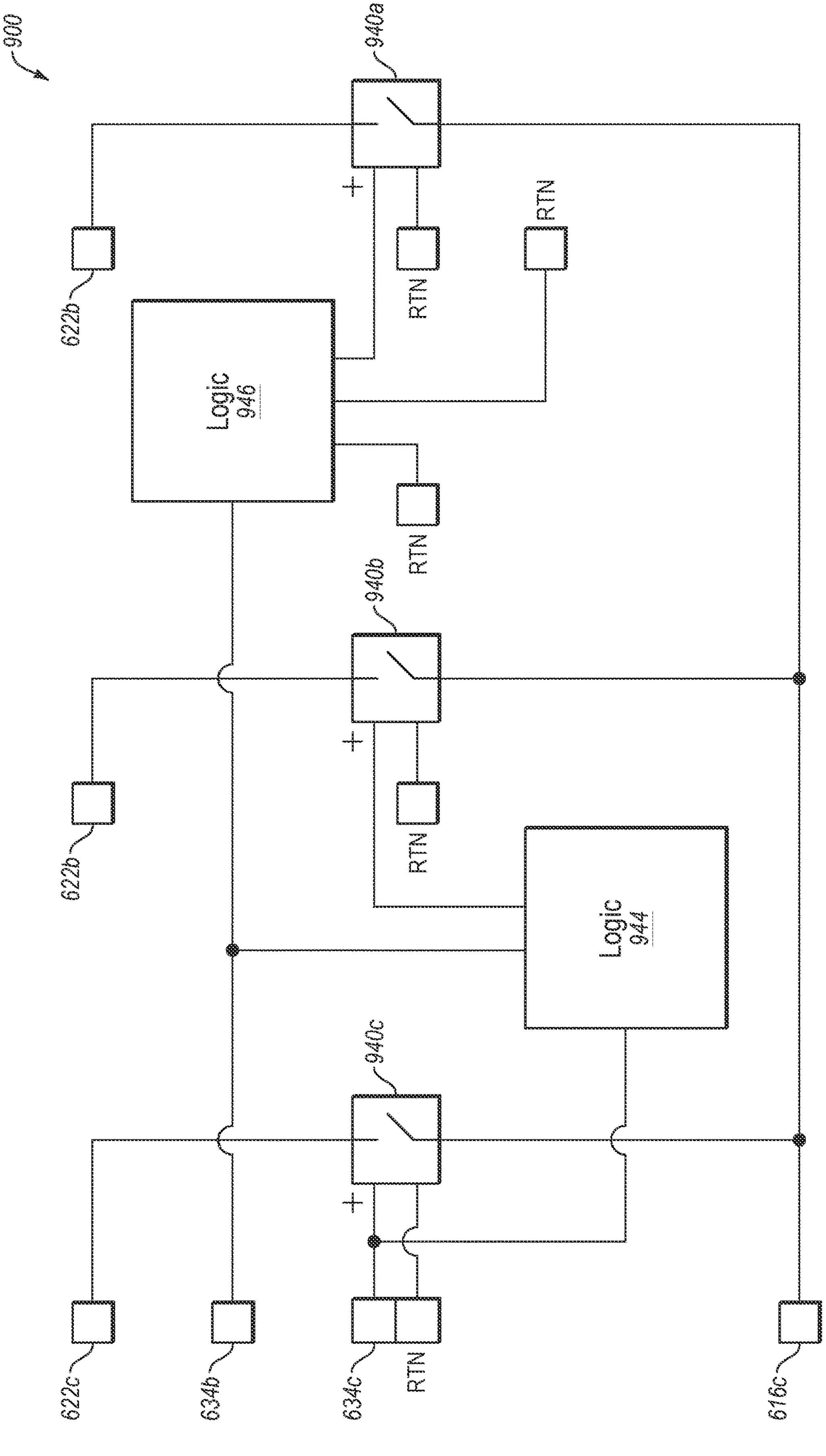
FIG. 9 is a functional block diagram illustrating yet another circuit according to one or more examples.

FIG. 9 is a functional block diagram illustrating a circuit 900 according to one or more examples. Circuit 900 is a non-limiting example of an implementation of circuit 636*c* of FIG. 6.

Circuit 900 may operate according to the example rules for governing relationships between timing signals 616 described above with regard to FIG. 6. Circuit 900 may include a switch 940*a*, a switch 940*b*, a switch 940*c*, logic 944, and logic 946. Circuit 900 may provide one of incoming timing signal 622*a*, incoming timing signal 622*b*, or incoming timing signal 622*c* as timing signal 616*c* dependent on control signal 634*b* and control signal 634*c*. For example, if control signal 634*c* indicates that timing signal 616*c* is to be provided, and to be synchronized with timing signal 616*b* (timing signal 616*b* not shown), and control signal 634*b* indicates that timing signal 616*b* is to be synchronized with timing signal 616*a* (timing signal 616*a* not shown), circuit 900 may provide incoming timing signal 622*a* as timing signal 616*c* by closing switch 940*a* and opening switches 940*b* and 940*c*. (Because timing signal 616*a* may be timing signal 622*a*, providing timing signal 622*a* as timing signal 616*c* may synchronize timing signal 616*c* with timing signal 616*a*.) Else, if control signal 634*c* indicates that timing signal 616*c* is to be provided, and to be synchronized with timing signal 616*b*, and control signal 634*b* indicates that timing signal 616*b* is not to be synchronized with timing signal 616*a*, circuit 900 may provide incoming timing signal 622*b* as timing signal 616*c* by closing switch 940*b* and opening switches 940*a* and 940*c*. (Because timing signal 616*b*, when not synchronized with timing signal 616*a*, may be timing signal 622*b*, providing timing signal 622*b* as timing signal 616*c* may synchronize timing signal 616*c* with timing signal 616*b*.) Else, if control signal 634*c* indicates that timing signal 616*c* is to be provided, but not to be synchronized with timing signal 616*b*, incoming timing signal 622*c* may be provided as timing signal 616*c* by closing switch 940*c* and opening switches 940*a* and 940*b*.

A Karnaugh map for timing signal 616*c* provided by circuit 900 may be:

| | 634d:634c | | | |
|---|---|---|---|---|
| 634b | 0:0 | 0:1 | 1:1 | 1:0 |
| 0 | 622a | 622c | 622c | 622a |
| 1 | 622b | 622c | 622c | 622b |

Returning to FIG. 6, circuit 614, may delay incoming timing signal 622*a*, incoming timing signal 622*b*, and/or incoming timing signal 622*c* before providing timing signal 622*a*, timing signal 622*b*, and/or timing signal 622*c* to circuit 636*c*. Additionally or alternatively, circuit 614 may delay timing signal 616*c* before providing timing signal 616*c* at output 624*c*. The delay may account for path lengths, delay associated with circuit 614 (including delays associated with circuit 636*c*) and/or delays to synchronize timing signal 616*c* with any other of timing signals 616 to which timing signal 616*c* is to be synchronized.

Figure 10:
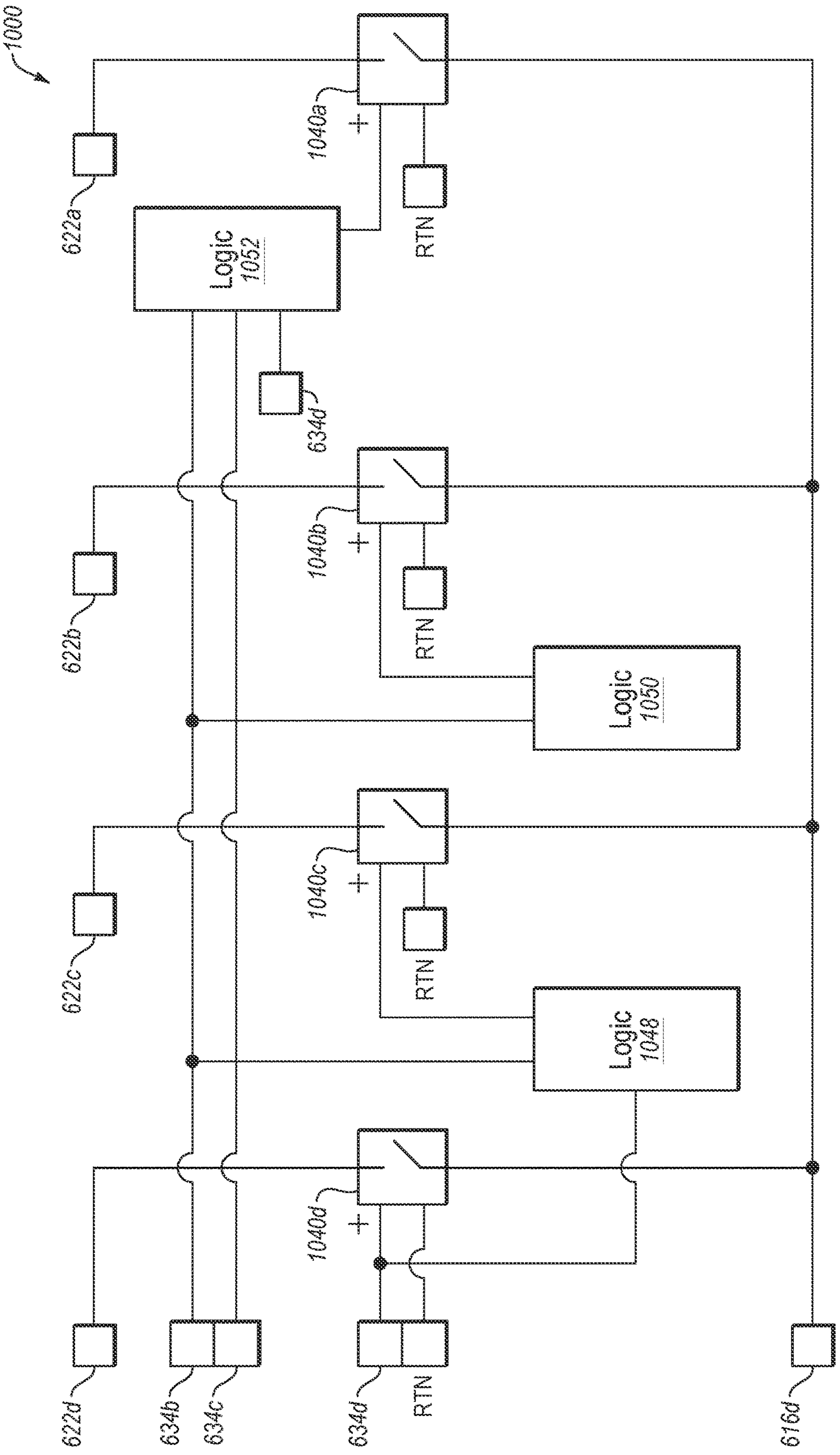
FIG. 10 is a functional block diagram illustrating yet another circuit according to one or more examples.

FIG. 10 is a functional block diagram illustrating a circuit 1000 according to one or more examples. Circuit 1000 is a non-limiting example of an implementation of circuit 636*d* of FIG. 6.

Circuit 1000 may operate according to the example rules for governing relationships between timing signals 616 described above with regard to FIG. 6. Circuit 1000 may include a switch 1040*a*, a switch 1040*b*, a switch 1040*c*, a switch 1040*d*, logic 1048, logic 1050, and logic 1052. Circuit 1000 may provide one of incoming timing signal 622*a*, incoming timing signal 622*b*, incoming timing signal 622*c* or incoming timing signal 622*d* as timing signal 616*d* dependent on control signal 634*b*, control signal 634*c*, and control signal 634*d*. For example, if control signal 634*d* indicates that timing signal 616*d* is to be provided, and to be synchronized with timing signal 616*c* (timing signal 616*c* not shown), and control signal 634*c* indicates that timing signal 616*c* is to be synchronized with timing signal 616*b* (timing signal 616*b* not shown), and control signal 634*b* indicates that timing signal 616*b* is to be synchronized with timing signal 616*a* (timing signal 616*a* not shown), circuit 1000 may provide incoming timing signal 622*a* as timing signal 616*d* by closing switch 1040*a* and opening switches 1040*b*, 1040*c* and 1040*d*. (Because timing signal 616*a* may be timing signal 622*a*, providing timing signal 622*a* as timing signal 616*d* may synchronize timing signal 616*d* with timing signal 616*a*.) Else, if control signal 634*d* indicates that timing signal 616*d* is to be provided, and to be synchronized with timing signal 616*c*, and control signal 634*c* indicates that timing signal 616*c* is to be synchronized with timing signal 616*b*, and control signal 634*b* indicates that timing signal 616*b* is not to be synchronized with timing signal 616*a*, circuit 1000 may provide incoming timing signal 622*b* as timing signal 616*d* by closing switch 1040*b* and opening switches 1040*a*, 1040*c* and 1040*d*. (Because timing signal 616*b*, when not synchronized with timing signal 616*a*, may be timing signal 622*b*, providing timing signal 622*b* as timing signal 616*d* may synchronize timing signal 616*d* with timing signal 616*b*.) Else, if control signal 634*d* indicates that timing signal 616*d* is to be provided, and to be synchronized with timing signal 616*c*, and control signal 634*c* indicates that timing signal 616*c* is not to be synchronized with timing signal 616*b*, circuit 1000 may provide incoming timing signal 622*c* as timing signal 616*d* by closing switch 1040*c* and opening switches 1040*a*, 1040*b* and 1040*d*. (Because timing signal 616*c*, when not synchronized with timing signal 616*b*, may be timing signal 622*c*, providing timing signal 622*c* as timing signal 616*d* may synchronize timing signal 616*d* with timing signal 616*c*.) Else, if control signal 634*d* indicates that timing signal 616*d* is to be provided, but not to be synchronized with timing signal 616*c*, incoming timing signal 622*d* may be provided as timing signal 616*d* by closing switch 1040*d* and opening switches 1040*a*, 1040*b* and 1040*c*.

A Karnaugh map for timing signal 616*d* provided by circuit 1000 may be:

| | 634d:634c | | | |
|---|---|---|---|---|
| 634b | 0:0 | 0:1 | 1:1 | 1:0 |
| 0 | 622a | 622c | 622d | 622d |
| 1 | 622b | 622c | 622d | 622d |

Returning to FIG. 6, circuit 614, may delay incoming timing signal 622*a*, incoming timing signal 622*b*, incoming timing signal 622*c* and/or incoming timing signal 622*d* before providing timing signal 622*a*, timing signal 622*b*, timing signal 622*c*, and/or timing signal 622*d* to circuit 636*d*. Additionally or alternatively, circuit 614 may delay timing signal 616*d* before providing timing signal 616*d* at output 624*d*. The delay may account for path lengths, delay associated with circuit 614 (including delays associated with circuit 636*d*) and/or delays to synchronize timing signal 616*a*, timing signal 616*b*, timing signal 616*c*, and/or timing signal 616*d* with any other of timing signals 616 to which timing signal 616*d* is to be synchronized.

Figure 11:
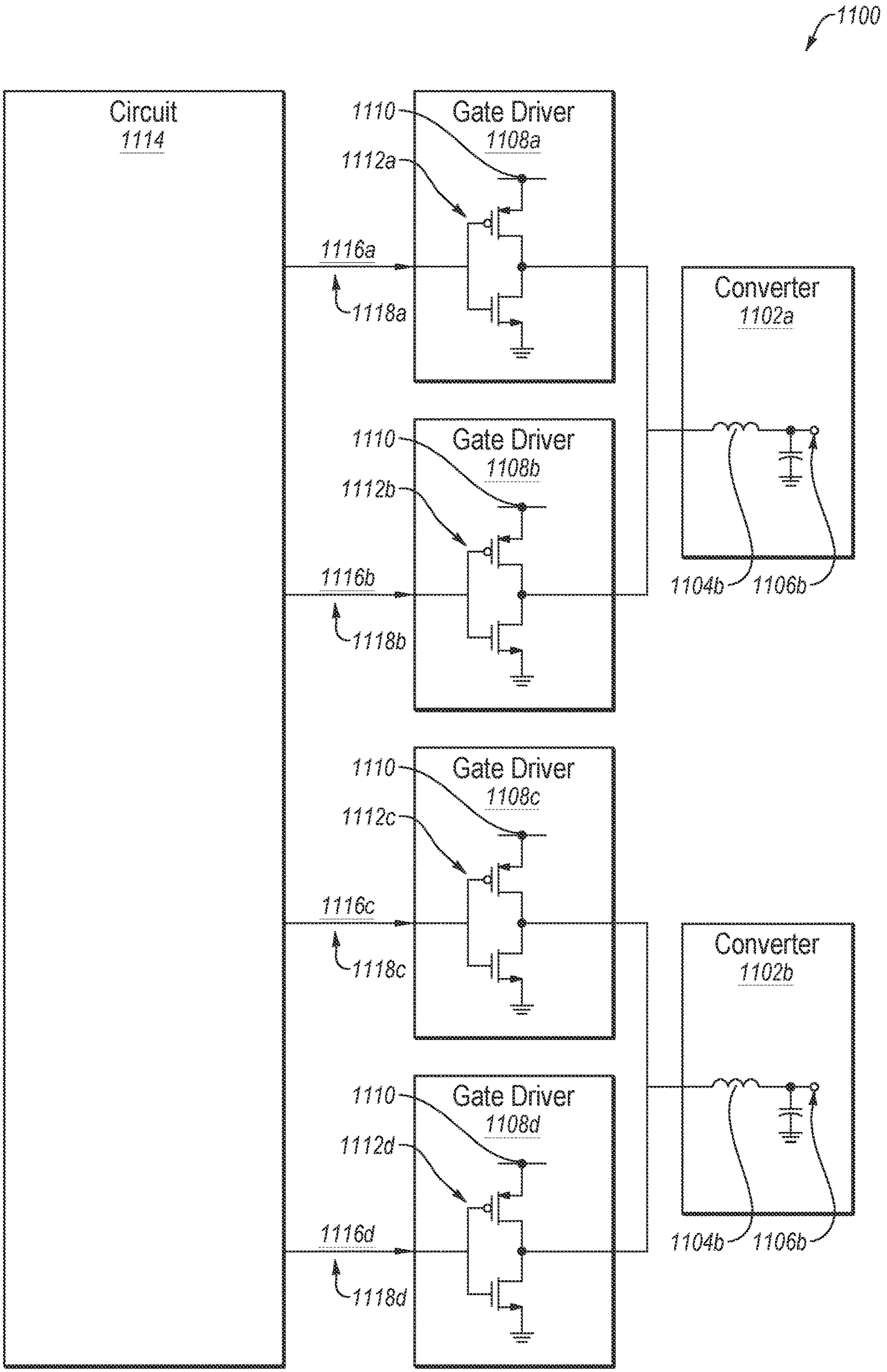
FIG. 11 is a functional block diagram illustrating yet another apparatus according to one or more examples.

FIG. 11 is a functional block diagram illustrating an apparatus 1100 according to one or more examples. Apparatus 1100 may include circuit 1114. Circuit 1114 is an example of circuit 514 of FIG. 5 or of circuit 614 of FIG. 6. Apparatus 1100 is an example of a circuit 1114 providing a selectable number of timing signals 1116. In particular, apparatus 1100 provides timing signal 1116*a* and timing signal 1116*b*, which may be synchronized with each other. Apparatus 1100 additionally provides timing signal 1116*c* and timing signal 1116*d*, which may be synchronized with each other, and which may or may not be synchronized with timing signal 1116*a* and timing signal 1116*b*.

Apparatus 1100 may include a converter 1102*a* including an inductor 1104*a*. Apparatus 1100 may include a plurality of gate drivers (i.e., gate driver 1108*a* and gate driver 1108*b*) including respective switches (i.e., switch 1112*a* and switch 1112*b*) coupled between a supply-voltage line 1110 and a terminal of inductor 1104*a* of converter 1102*a*. Apparatus 1100 may include a circuit 1114 to provide respective timing signals (i.e., timing signal 1116*a* and timing signal 1116*b*) to the respective switches (i.e., switch 1112*a* and switch 1112*b*) of the plurality of gate drivers (i.e., gate driver 1108*a* and gate driver 1108*b*) to control the plurality of gate drivers (i.e., gate driver 1108*a* and gate driver 1108*b*) to control an output voltage 1106*a* of converter 1102*a*. Circuit 1114 may synchronize the timing signals (i.e., timing signal 1116*a* and timing signal 1116*b*) such that like edges (i.e., leading edges 1118*a* and leading edges 1118*b*) of the timing signals (i.e., timing signal 1116*a* and timing signal 1116*b*) coincide.

Apparatus 1100 may include a further converter 1102*b* including a further inductor 1104*b*. Apparatus 1100 may include one or more further gate drivers (e.g., gate driver 1108*c* and gate driver 1108*d*) including further respective switches (i.e., switch 1112*c* and switch 1112*d*) coupled between supply-voltage line 1110 and a terminal of further inductor 1104*b*. Circuit 1114 may provide further respective timing signals (i.e., timing signal 1116*c* and timing signal 1116*d*) to the further switches (i.e., switch 1112*c* and switch 1112*d*) of the one or more further gate drivers (i.e., gate driver 1108*c* and gate driver 1108*d*) to control the one or more further gate drivers (i.e., gate driver 1108*c* and gate driver 1108*d*) to control a further output voltage 1106*b* of further converter 1102*b*.

Figure 12:
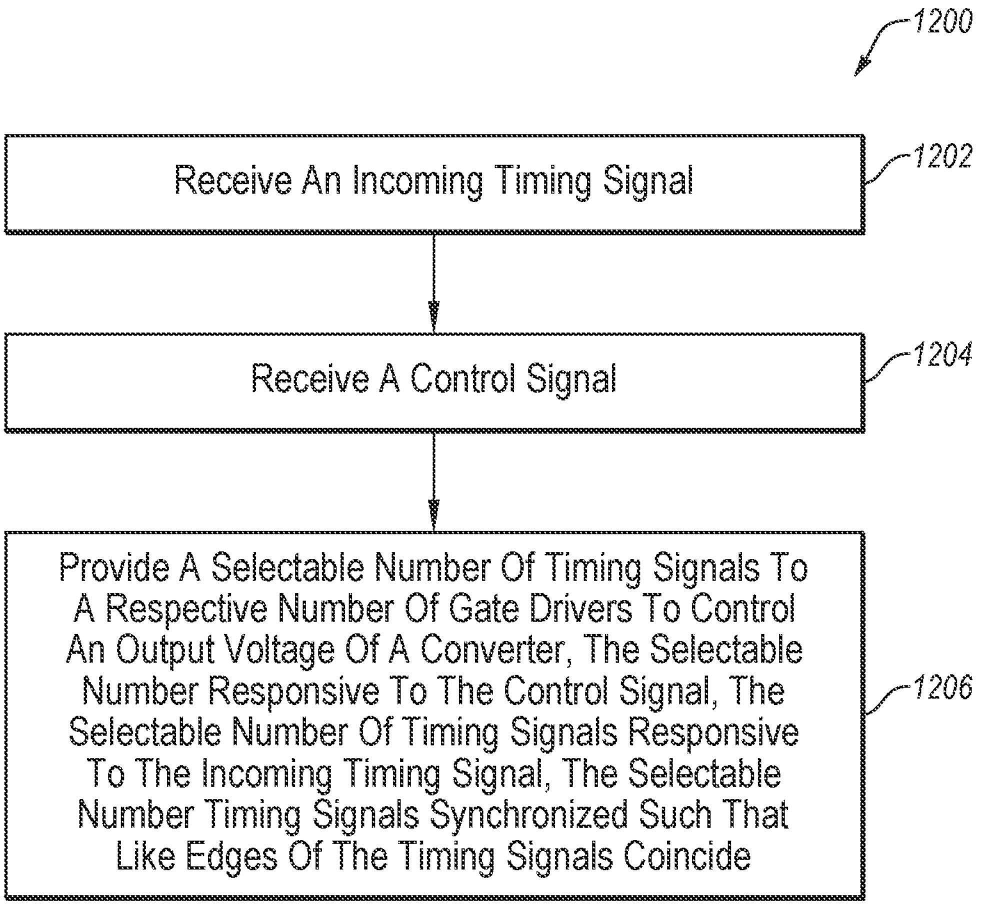
FIG. 12 is a flow chart illustrating an example method according to one or more examples.

FIG. 12 is a flowchart of a method 1200, according to one or more examples. At least a portion of method 1200 may be performed, in some examples, by a device or system, such as apparatus 100 of FIG. 1, circuit 114 of FIG. 1, apparatus 200 of FIG. 2, circuit 214 of FIG. 2, apparatus 300 of FIG. 3, circuit 314 of FIG. 3, apparatus 400 of FIG. 4, circuit 414 of FIG. 4, apparatus 500 of FIG. 5, circuit 514 of FIG. 5, apparatus 600 of FIG. 6, circuit 614 of FIG. 6, circuit 700 of FIG. 7, circuit 800 of FIG. 8, circuit 900 of FIG. 9, circuit 1000 of FIG. 10, apparatus 1100 of FIG. 11, circuit 1114 of FIG. 11, or another device or system. Although illustrated as discrete blocks, various blocks may be divided into additional blocks, combined into fewer blocks, or eliminated, depending on the desired implementation.

At operation 1202, an incoming timing signal may be received. Incoming timing signal 222 of FIG. 2, timing signal 322 incoming timing signal 422 of FIG. 4, incoming timing signal 622 of FIG. 6, incoming timing signal 622*a* of FIG. 6, FIG. 7, FIG. 8, FIG. 9, and FIG. 10, incoming timing signal 622*b* of FIG. 6, FIG. 8, FIG. 9, and FIG. 10, incoming timing signal 622*c* of FIG. 6, FIG. 9, and FIG. 10, incoming timing signal 622*d* of FIG. 6 and FIG. 10 are all examples of the incoming timing signal that may be received at operation 1202.

At operation 1204, a control signal may be received. Control signal 534 of FIG. 5, control signal 634 of FIG. 6, control signal 634*a* of FIG. 6 and FIG. 7, control signal 634*b* of FIG. 6, FIG. 8, FIG. 9, and FIG. 10, control signal 634*c* of FIG. 6, FIG. 9, and FIG. 10, and control signal 634*d* of FIG. 6, and FIG. 10 are all examples of the control signal that may be received at operation 1204.

At operation 1206, a selectable number of timing signals may be provided to a respective number of gate drivers to control an output voltage of a converter (e.g., a DC-to-DC converter such as a buck converter, without limitation). The selectable number may be responsive to the control signal. The selectable number of timing signals may be responsive to the incoming timing signal. The selectable number of timing signals may be synchronized such that like edges of the timing signals coincide. Timing signals 116 of FIG. 1, timing signals 216 of FIG. 2, timing signals 316 of FIG. 3, timing signals 416 of FIG. 4, timing signals 516 of FIG. 5, timing signals 616 of FIG. 6 through FIG. 10, and timing signals 1116 of FIG. 11 are all examples of the selectable number of timing signals that may be provided at operation 1206.

Modifications, additions, or omissions may be made to method 1200 without departing from the scope of the present disclosure. For example, the operations of method 1200 may be implemented in differing order. Furthermore, the outlined operations and actions are only provided as examples, and some of the operations and actions may be optional, combined into fewer operations and actions, or expanded into additional operations and actions without detracting from the essence of the disclosed example.

Figure 13:
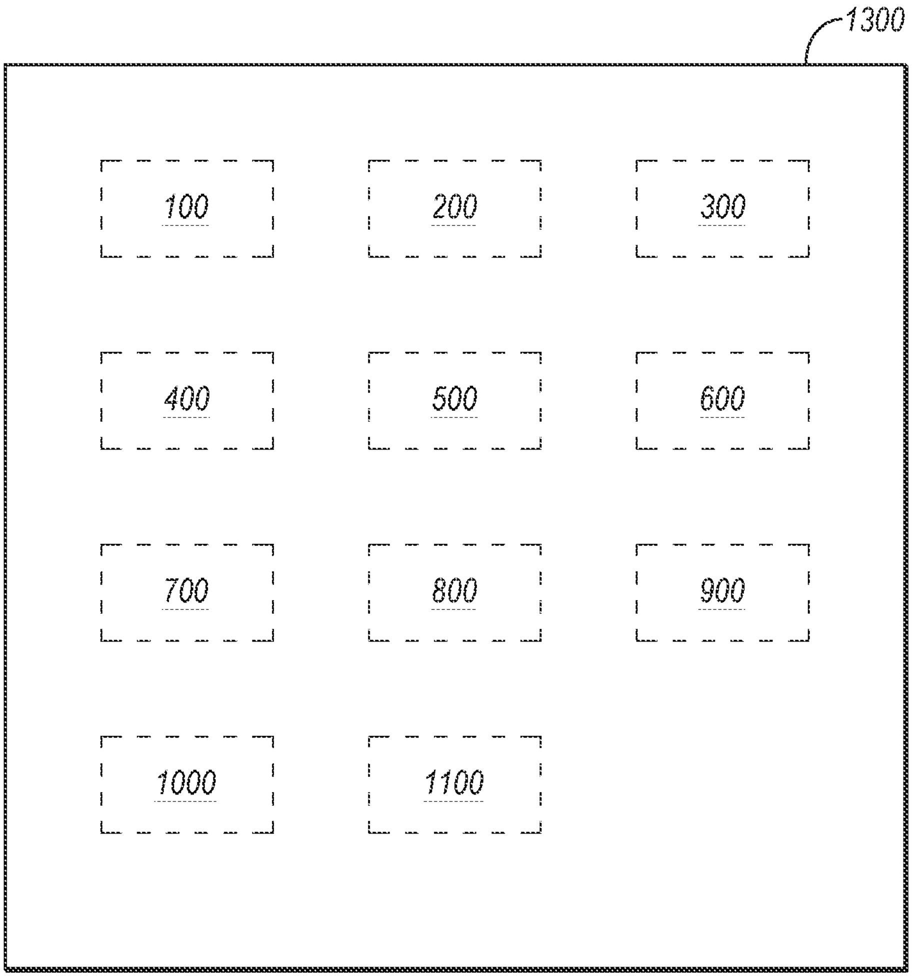
FIG. 13 is a functional block diagram illustrating yet another apparatus according to one or more examples.

FIG. 13 is a functional block diagram illustrating an apparatus 1300 according to one or more examples. Apparatus 1300 may be any of an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform one or more operations described herein or implement one or more circuits or apparatuses described herein. For example, apparatus 1300 may implement any of: apparatus 100 (including gate drivers 108 and/or circuit 114) of FIG. 1, apparatus 200 (including gate drivers 208 and/or circuit 214) of FIG. 2, apparatus 300 (including gate drivers 308 and/or circuit 314) of FIG. 3, apparatus 400 (including gate drivers 408 and/or circuit 414) of FIG. 4, apparatus 500 (including gate drivers (not shown) and/or circuit 514) of FIG. 5, apparatus 600 (including gate drivers (not shown), circuit 614, circuit 636*a*, circuit 636*b*, circuit 636*c*, and/or circuit 636*d*) of FIG. 6, circuit 700 of FIG. 7, circuit 800 of FIG. 8, circuit 900 of FIG. 9, circuit 1000 of FIG. 10, and/or circuit apparatus 1100, (including circuit 1114) of FIG. 11, and/or any portion thereof. Additionally or alternatively, apparatus 1300 may perform one or more operations associated with method 1200.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used in the present disclosure, the terms "module" or "component" may refer to specific hardware implementations that may perform the actions of the module or component or software objects or software routines that may be stored on or executed by general purpose hardware (e.g., computer-readable media, processing devices, without limitation) of the computing system. In one or more examples, the different components, modules, engines, and services described in the present disclosure may be implemented as objects or processes that execute on the computing system (e.g., as separate threads, without limitation). While some of the system and methods described in the present disclosure are generally described as being implemented in software (stored on or executed by general purpose hardware), specific hardware implementations or a combination of software and specific hardware implementations are also possible and contemplated.

As used in the present disclosure, the term "combination" with reference to a plurality of elements may include a combination of all the elements or any of various different sub-combinations of some of the elements. For example, the phrase "A, B, C, D, or combinations thereof" may refer to any one of A, B, C, or D; the combination of each of A, B, C, and D; and any sub-combination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," without limitation). As used herein, "each" means "some or a totality." As used herein, "each and every" means "a totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" or "an" means "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation" or "one or more of A, B, and C, without limitation" is used, in general, such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples of the disclosure may include:

Example 1: An apparatus comprising: a circuit comprising: a timing input to receive an incoming timing signal; and a plurality of outputs to couple to a respective plurality of gate drivers to control an output voltage of a converter; the circuit to provide respective timing signals, at respective ones of the plurality of outputs at least partially responsive to the incoming timing signal, the respective timing signals synchronized such that like edges of the respective timing signals coincide.

Example 2: The apparatus according to Example 1, wherein the circuit comprises respective lines between the timing input and the respective ones of the plurality of outputs, the respective lines defining a same path length between the timing input and the respective ones of the plurality of outputs.

Example 3: The apparatus according to any of Examples 1 and 2, wherein the circuit comprises one or more delay cells, the circuit to apply the incoming timing signal to the one or more delay cells to synchronize the respective timing signals provided at the respective ones of the plurality of outputs.

Example 4: The apparatus according to any of Examples 1 through 3, wherein the circuit is configurable to provide a selectable number of synchronized timing signals at least partially responsive to the incoming timing signal.

Example 5: The apparatus according to any of Examples 1 through 4, wherein the circuit comprises one or more control inputs to receive one or more respective control signals, the circuit to provide the selectable number of synchronized timing signals at least partially responsive to the one or more respective control signals.

Example 6: The apparatus according to any of Examples 1 through 5, wherein the apparatus comprises a number of additional timing inputs to receive a respective number of incoming additional timing signals, and wherein the circuit to provide a respective selectable number of synchronized timing signals at least partially responsive to respective ones of the incoming additional timing signals and the incoming timing signal.

Example 7: The apparatus according to any of Examples 1 through 6, wherein the circuit comprises control inputs to receive respective control signals, the circuit to provide the respective selectable number of synchronized timing signals at least partially responsive to the respective control signals.

Example 8: An apparatus comprising: a circuit comprising: a control input to receive a control signal; and a number of outputs; the circuit to provide a selectable number of timing signals, at respective ones of the number of outputs, at least partially responsive to the control signal.

Example 9: The apparatus according to Example 8, wherein the circuit to synchronize the selectable number of timing signals such that like edges of the selectable number of timing signals coincide.

Example 10: The apparatus according to any of Examples 8 and 9, wherein the circuit comprises respective lines between a timing input and the respective ones of the number of outputs, the respective lines defining a same path length between the timing input and the respective ones of the number of outputs.

Example 11: The apparatus according to any of Examples 8 through 10, wherein the circuit comprises one or more delay cells, the circuit to apply an incoming timing signal to the one or more delay cells to synchronize the selectable number of timing signals.

Example 12: The apparatus according to any of Examples 8 through 11, comprising a timing input to receive an incoming timing signal, the circuit to provide the selectable number of timing signals at the respective ones of the number of outputs at least partially responsive to the incoming timing signal and the control signal.

Example 13: The apparatus according to any of Examples 8 through 12, wherein the apparatus comprises a number of timing inputs to receive a respective number of incoming timing signals and wherein the circuit to provide the selectable number of timing signals at least partially responsive to respective ones of the respective number of incoming timing signals.

Example 14: An apparatus comprising: a converter comprising an inductor; a plurality of gate drivers comprising respective switches coupled between a supply-voltage line and a terminal of the inductor; and a circuit to provide respective timing signals to the respective switches of the plurality of gate drivers to control the plurality of gate drivers to control an output voltage of the converter, the circuit to synchronize the respective timing signals such that like edges of the respective timing signals coincide.

Example 15: The apparatus according to Example 14, comprising: a further converter comprising a further inductor; and one or more further gate drivers comprising further respective switches coupled between the supply-voltage line and a terminal of the further inductor, wherein the circuit to provide respective further timing signals to the further respective switches of the one or more further gate drivers to control the one or more further gate drivers to control a further output voltage of the further converter.

Example 16: The apparatus according to any of Examples 14 and 15, wherein the circuit to provide a first selectable number of timing signals to the plurality of gate drivers and a second selectable number of further timing signals to the one or more further gate drivers.

Example 17: The apparatus according to any of Examples 14 through 16, wherein the circuit to synchronize the respective further timing signals such that like leading edges of the respective further timing signals coincide.

Example 18: The apparatus according to any of Examples 14 through 17, wherein the circuit comprises respective lines between a timing input and the respective switches of the plurality of gate drivers, the respective lines defining the same path length between the timing input and the respective switches of the plurality of gate drivers.

Example 19: The apparatus according to any of Examples 14 through 18, wherein the circuit comprises one or more delay cells, the one or more delay cells to apply respective delays to an incoming timing signal, to synchronize the timing signals provided to respective switches of the plurality of gate drivers.

Example 20: A method comprising: receiving an incoming timing signal; receiving a control signal; and providing a selectable number of timing signals to a respective number of gate drivers to control an output voltage of a converter, the selectable number responsive to the control signal, the selectable number of timing signals responsive to the incoming timing signal, the selectable number of timing signals synchronized such that like edges of the selectable number of timing signals coincide.

While the present disclosure has been with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus comprising:

a circuit comprising:

a timing input to receive an incoming timing signal; and a plurality of outputs to couple to a respective plurality of gate drivers for which an associated switch controls an output voltage of a converter; and the circuit to provide respective timing signals, at respective ones of the plurality of outputs at least partially responsive to the incoming timing signal, the respective timing signals synchronized such that like edges of the respective timing signals coincide, wherein the circuit aligns timing of turning ON one or more of the plurality of gate drivers relative to one another such that at least two separate but similar switches associated with the plurality of gate drivers provide current to the converter via multiple parallel gate driver paths.

2. The apparatus of claim 1, wherein the circuit comprises respective lines between the timing input and the respective ones of the plurality of outputs, the respective lines defining a same path length between the timing input and the respective ones of the plurality of outputs.

3. The apparatus of claim 1, wherein the circuit comprises one or more delay cells, the circuit to apply the incoming timing signal to the one or more delay cells to synchronize the respective timing signals provided at the respective ones of the plurality of outputs.

4. The apparatus of claim 1, wherein the circuit is configurable to provide a selectable number of synchronized timing signals at least partially responsive to the incoming timing signal.

5. The apparatus of claim 4, wherein the circuit comprises one or more control inputs to receive one or more respective control signals, the circuit to provide the selectable number of synchronized timing signals at least partially responsive to the one or more respective control signals.

6. The apparatus of claim 1, wherein the apparatus comprises a number of additional timing inputs to receive a respective number of incoming additional timing signals, and wherein the circuit to provide a respective selectable number of synchronized timing signals at least partially responsive to respective ones of the incoming additional timing signals and the incoming timing signal.

7. The apparatus of claim 6, wherein the circuit comprises control inputs to receive respective control signals, the circuit to provide the respective selectable number of synchronized timing signals at least partially responsive to the respective control signals.

8. An apparatus comprising:

a circuit comprising:

a timing input to receive an incoming timing signal;

a control input to receive a control signal; and a number of outputs to couple to a respective plurality of gate drivers for which an associated switch controls an output voltage of a converter;

the circuit to provide a selectable number of timing signals, at respective ones of the number of outputs, at least partially responsive to the control signal, wherein the circuit aligns timing of turning ON one or more of the plurality of gate drivers relative to one another, the plurality of gate drivers comprising at least two separate and distinct switches that provide current to the converter via multiple parallel paths.

9. The apparatus of claim 8, wherein the circuit to synchronize the selectable number of timing signals such that like edges of the selectable number of timing signals coincide.

10. The apparatus of claim 9, wherein the circuit comprises respective lines between a timing input and the respective ones of the number of outputs, the respective lines defining a same path length between the timing input and the respective ones of the number of outputs.

11. The apparatus of claim 9, wherein the circuit comprises one or more delay cells, the circuit to apply an incoming timing signal to the one or more delay cells to synchronize the selectable number of timing signals.

12. The apparatus of claim 8, comprising a timing input to receive an incoming timing signal, the circuit to provide the selectable number of timing signals at the respective ones of the number of outputs at least partially responsive to the incoming timing signal and the control signal.

13. The apparatus of claim 8, wherein the apparatus comprises a number of timing inputs to receive a respective number of incoming timing signals and wherein the circuit to provide the selectable number of timing signals at least partially responsive to respective ones of the respective number of incoming timing signals.

14. An apparatus comprising:

a converter comprising an inductor;

a plurality of gate drivers comprising respective switches coupled between a supply-voltage line and a terminal of the inductor; and a circuit to provide respective timing signals to the respective switches of the plurality of gate drivers to control the plurality of gate drivers to control an output voltage of the converter, the circuit to synchronize the respective timing signals such that like edges of the respective timing signals coincide, wherein the circuit aligns timing of turning ON one or more of the plurality of gate drivers relative to one another, the plurality of gate drivers comprising at least two separate and distinct switches that provide current to the converter via multiple parallel paths.

15. The apparatus of claim 14, comprising:

a further converter comprising a further inductor; and one or more further gate drivers comprising further respective switches coupled between the supply-voltage line and a terminal of the further inductor, wherein the circuit to provide respective further timing signals to the further respective switches of the one or more further gate drivers to control the one or more further gate drivers to control a further output voltage of the further converter.

16. The apparatus of claim 15, wherein the circuit to provide a first selectable number of timing signals to the plurality of gate drivers and a second selectable number of further timing signals to the one or more further gate drivers.

17. The apparatus of claim 15, wherein the circuit to synchronize the respective further timing signals such that like leading edges of the respective further timing signals coincide.

18. The apparatus of claim 14, wherein the circuit comprises respective lines between a timing input and the respective switches of the plurality of gate drivers, the respective lines defining the same path length between the timing input and the respective switches of the plurality of gate drivers.

19. The apparatus of claim 14, wherein the circuit comprises one or more delay cells, the one or more delay cells to apply respective delays to an incoming timing signal, to synchronize incoming timing signals provided to respective switches of the plurality of gate drivers.

20. A method comprising:

receiving an incoming timing signal;

receiving a control signal; and providing a selectable number of timing signals to a respective number of gate drivers to control an output voltage of a converter, the selectable number of timing signals responsive to the control signal, the selectable number of timing signals responsive to the incoming timing signal, the selectable number of timing signals synchronized such that like edges of the selectable number of timing signals coincide, wherein a circuit aligns timing of turning ON one or more of the respective number of gate drivers relative to one another, the respective number of gate drivers comprising at least two separate and distinct switches that provide current to the converter via multiple parallel paths.

* * * * *